United States Patent
Markow et al.

[11] Patent Number: 5,309,087
[45] Date of Patent: May 3, 1994

[54] AIR CORE GAUGE, MULTI-FREQUENCY PULSE WIDTH MODULATOR SYSTEM THEREFOR

[75] Inventors: Paul A. Markow, Huntsville; Kevin R. Hammond, Harvest; Donald E. Hutchings, Decatur, all of Ala.

[73] Assignee: Chrysler Corporation, Highland Park, Mich.

[21] Appl. No.: 941,622

[22] Filed: Sep. 8, 1992

[51] Int. Cl.$^5$ .................. G01R 5/16; G01R 23/00
[52] U.S. Cl. .................. 324/146; 324/143; 324/167; 324/76.48; 364/484; 364/571.07; 377/19
[58] Field of Search .............. 324/166, 167, 143, 144, 324/146, 154 R, 76.47, 76.48; 364/484, 571.07; 377/2, 19

[56] References Cited

U.S. PATENT DOCUMENTS

| | | | |
|---|---|---|---|
| 4,230,984 | 10/1980 | Taylor | 324/167 X |
| 4,924,178 | 5/1990 | Miyajima | 324/167 X |
| 5,017,861 | 5/1991 | Hukuda | 324/143 |
| 5,051,688 | 9/1991 | Murase et al. | 324/143 |

FOREIGN PATENT DOCUMENTS

| | | | |
|---|---|---|---|
| 509484A | 10/1992 | European Pat. Off. | 324/143 |
| 1-150864 | 6/1989 | Japan | 324/146 |
| 1-201167 | 8/1989 | Japan | 324/146 |
| 2-80968 | 3/1990 | Japan | 324/146 |
| 2-141670 | 5/1990 | Japan | 324/146 |
| 3-103769 | 4/1991 | Japan | 324/146 |

*Primary Examiner*—Gerard R. Strecker
*Attorney, Agent, or Firm*—Wendell K. Fredericks

[57] ABSTRACT

A pulse-width modulation system provides means for controlling dual-coil, air-core gauges at a various rates over 360 degrees. The system moves a dial needle from one octant of the gauge to the next in response to coded data representing measurands by holding one coil at 100% duty cycle while applying a PWM of a varying duty signal to the other coil. When the magnitude of the measurand dictates that the needle should move into another octant of the dial, the PWM signal and the 100% duty cycle signal are interchanged between the coils in a manner permitting the needle to move to other octants of the dial. The system includes a variable PWM count clock that permits selecting at least PWM rates and periods for forming PWM duty cycles ranging from 0% to 100%.

17 Claims, 7 Drawing Sheets

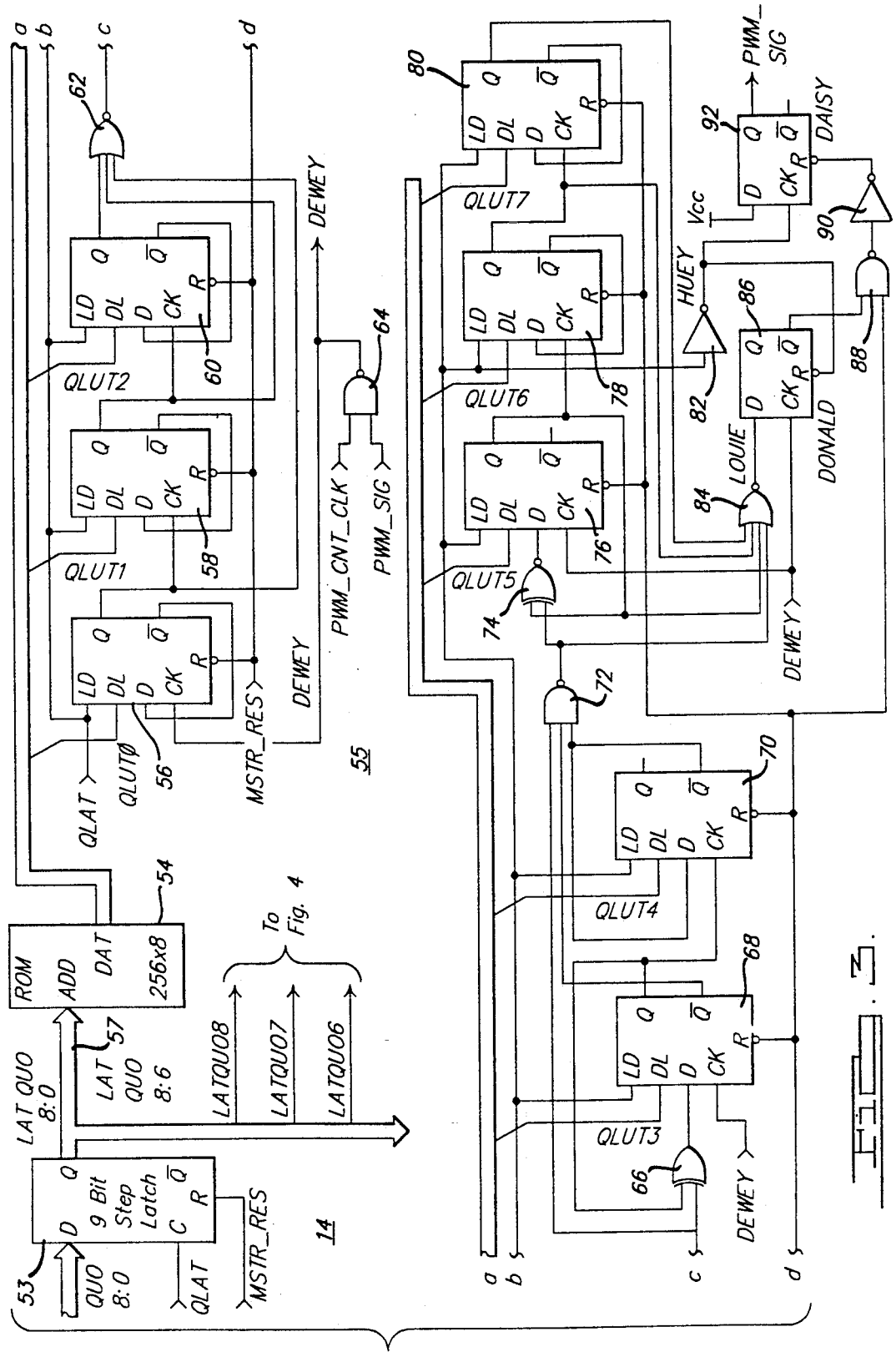

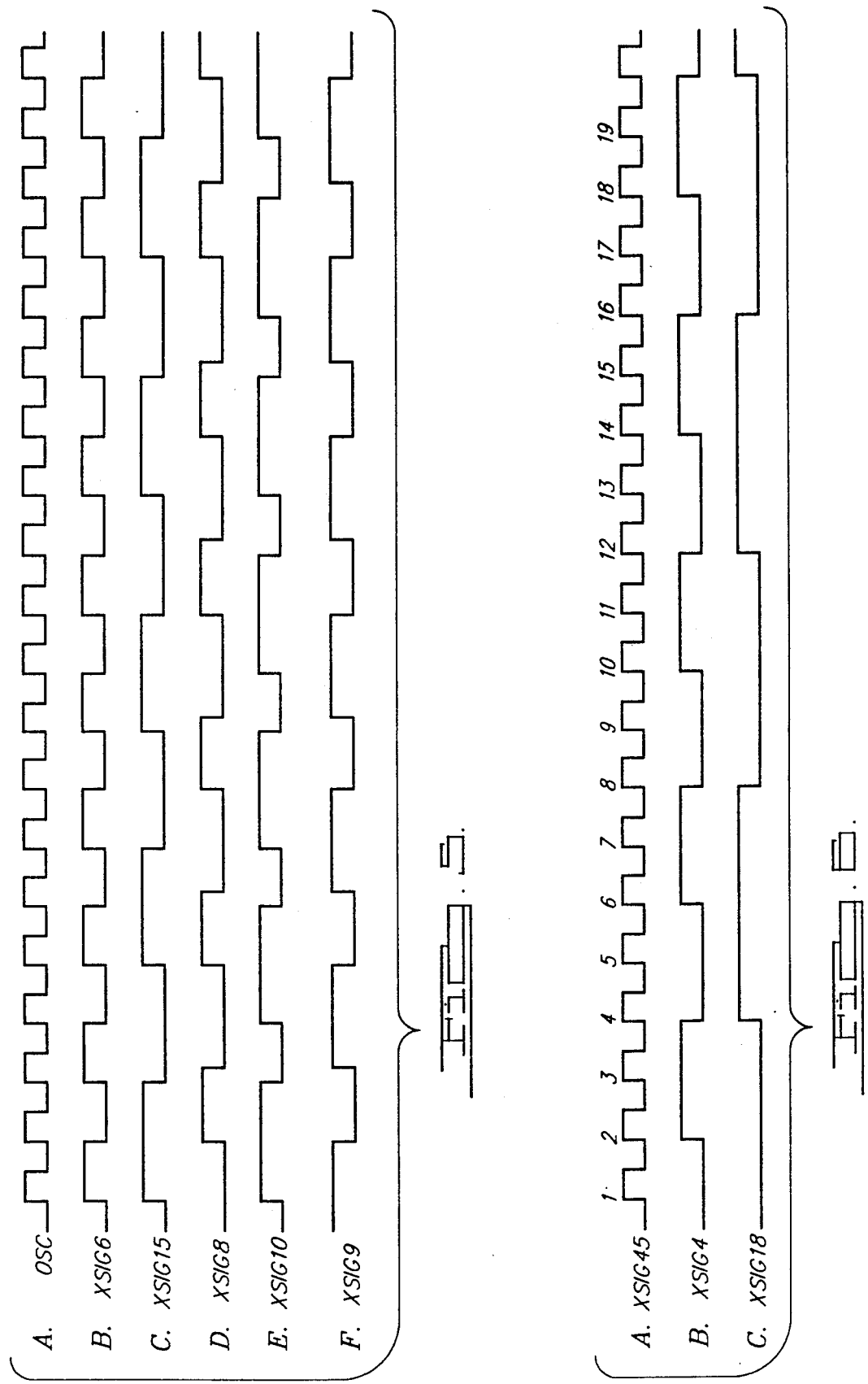

| OCTANT | LATQU08 | LATQU07 | LATQU06 | Y-POLARITY SPD-CTL0 | X-POLARITY SPD-CTL1 | Y-SIGNAL SPDCTL2 | X-SIGNAL SPDCTL3 | X-COIL | Y-COIL |
|---|---|---|---|---|---|---|---|---|---|
| 1(0-45) | 0 | 0 | 0 | 1 | 0 | PWM | ON 100% | -100% | PWM |
| 2(45-90) | 0 | 0 | 1 | 1 | 0 | ON 100% | PWM | -PWM | 100% |
| 3(90-135) | 0 | 1 | 0 | 1 | 1 | ON 100% | PWM | PWM | 100% |
| 4(135-180) | 0 | 1 | 1 | 1 | 1 | PWM | ON 100% | 100% | PWM |
| 5(180-225) | 1 | 0 | 0 | 0 | 1 | PWM | ON 100% | 100% | -PWM |
| 6(225-270) | 1 | 0 | 1 | 0 | 1 | ON 100% | PWM | PWM | -100% |
| 7(270-315) | 1 | 1 | 0 | 0 | 0 | ON 100% | PWM | -PWM | -100% |
| 8(315-360) | 1 | 1 | 1 | 0 | 0 | PWM | ON 100% | -100% | -PWM |
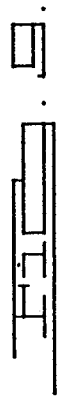

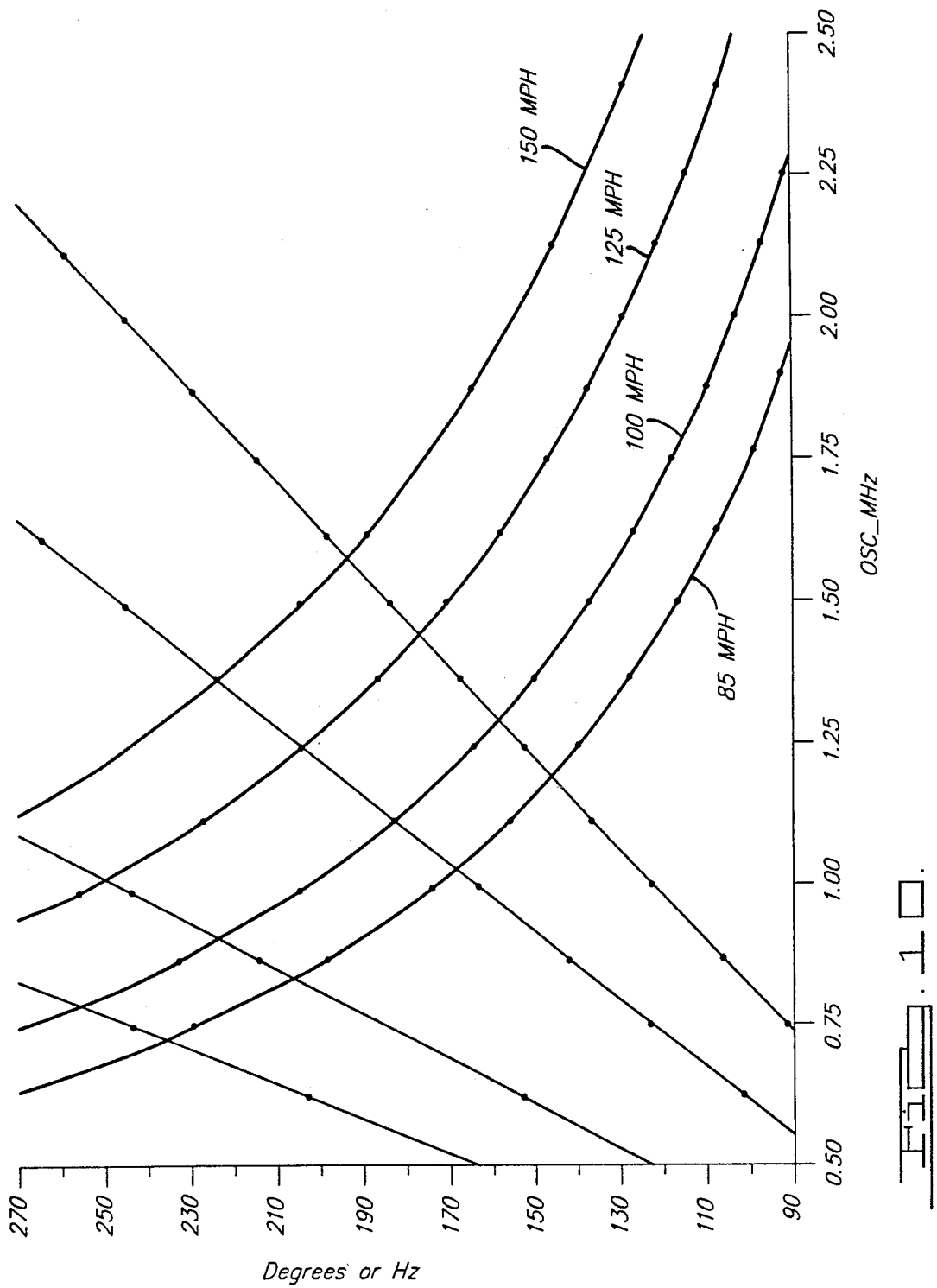

AIR CORE GAUGE, MULTI-FREQUENCY PULSE WIDTH MODULATOR SYSTEM THEREFOR

BACKGROUND OF THE INVENTION

1. Field of the Invention

The present invention relates to air-core gauge driver circuits and, in a preferred embodiment, to air-core gauge control schemes employing pulse width modulated (PWM) signals generated at a variety of frequency rates to compensate for various drive rates of several different gauges.

2. Description of Related Art

An air-core gauge normally has a rotor with a magnetic sensitive region disposed perpendicular to a dial shaft and a pair of stator windings; i.e, a COSINE or (X) winding and a SINE or (Y) winding fixedly arranged at right angles about the shaft. The gauge has a dial and a dial needle. The needle moves over quadrants (and octants of the quadrants) of the dial in, response to movement of the rotor.

Prior dual half-bridge drivers (H-drivers) control the gauge in response to a pair of PWM streams (PWM) and four current-direction signals to provide magnetic fields for rotating the rotor. The current-direction signals select the direction that current passes from each of the H-drives through the gauge windings to place the needle in each of four quadrants of the dial. The PWM signals, first and second positive pulse signals, control the direction and amount of needle movement over the dial within selected quadrants. The PWM signals cause changes in magnitude of the current passing through each winding.

Modulations of the current in the X and Y windings, respectively, vary between 0 and 100%. The modulations vary in proportion to related variations of COSINE and SINE wave function values between 0° and 90°. These function values define the angular position of the needle on the dial. Current in each winding varies in relation to the ON time durations of the modulated pulse stream to produce resultant magnetomotive force (MMF) vectors. The needle positions vary with respect to the vector sum of the SINE and COSINE waves that represent the equivalent % ON time of the PWM signal.

Illustratively, when a PWM signal applied to a Y-winding stays ON 20% of the time, the PWM signal on a X-winding stays ON approximately 97.5% of the time during the same cycle. The current and magnetic fields in the X-winding increase while the current and magnetic fields of the Y-winding decrease causing the rotor to rotate. Rotation continues until magnetic quiescence results between the two fields and the magnetic sensitive region of the rotor. The needle deflects to a location at about 11.25° on the dial. 11.25° corresponds to the vector sum of the COSINE and SINE functions when a 20% duration first PWM signal routes to the X-winding while a 97.5% duration second PWM signal routes to the Y-winding.

If the % ON time of the PWM signal on the X-winding changes to 97.5% while the % ON time of the PWM signal on the Y-winding changes to 20%, the needle seeks a location of about 78.75° on the dial. Of course, the % ON time of the two pulse streams changes back to the original 20:97.5%, or greater, then the quiescent affect of the fields causes the needle to rotate backwards towards the original 11.125° location on the dial.

A problem occurs in the prior push-pull type H-drivers when an attempt to move the needle from, e.g., a 6.4° position to 0° on the dial, or from 83° to 90° on the dial or vice-versa. The needle tends to stick for ratios of 5:99.5% or less. At these ratios, the magnetic field in the dominant winding appears to swamp or dwarf any affects of the magnetic field of the recessive winding. Hence, a quiescent result occurs that seems to bind the magnetic region of the rotor to the dominant field rather than to both fields.

Realizing the needle sticking problem of the push-pull H-driver/air-core gauge circuits, a search for other circuits and schemes to eliminate the problem was initiated. This search resulted in the improved device of the present invention.

SUMMARY OF THE INVENTION

A pulse width modulation system provides means for controlling dual coil air-core gauges up to 360 degrees of gauge needle sweep. The system includes ROM stored position data addressable by addresses derived from 9-bit binary values that represent gauge deflection steps. The position values stored in ROM, 8-bit counts (256 possible values), represent the PWM down count starting values. A count of 256 represents a 100% duty cycle. The upper 3-bits of the 9-bit addresses provide information for determining the octants in which to position the needle. The system oscillator provides the clock for deriving various clock signals for sequencing the logic to modulate the current that routes to one of the pair of H-drivers supplying current to the air-core gauge coils. One coil of the gauge is modulated while the other is held at a HIGH level to provide a 100% duty cycle. The logic is also configured to permit selecting the various drive rates for driving the coils. Torque is improved by always holding one coil at 100% duty cycle while the other coil is modulated. Control is improved by having the capability to position the gauge to 512 of a possible 2048 positions to allow for compensation of inherent gauge errors. Commanded steps of the gauge needle do not always equal the gauge graduations due to inherent errors related to mechanical and electrical structural interrelations of the gauge components. This system permits taking uneven space between steps to correct for gauge error.

IN THE DRAWINGS

FIG. 3 depicts a logic diagram of a preloadable-down counter used with the prescaled-counter circuit for developing various durations of PWM signals and control signals in response to the measurand data supplied to the meter systems;

Figure 2:
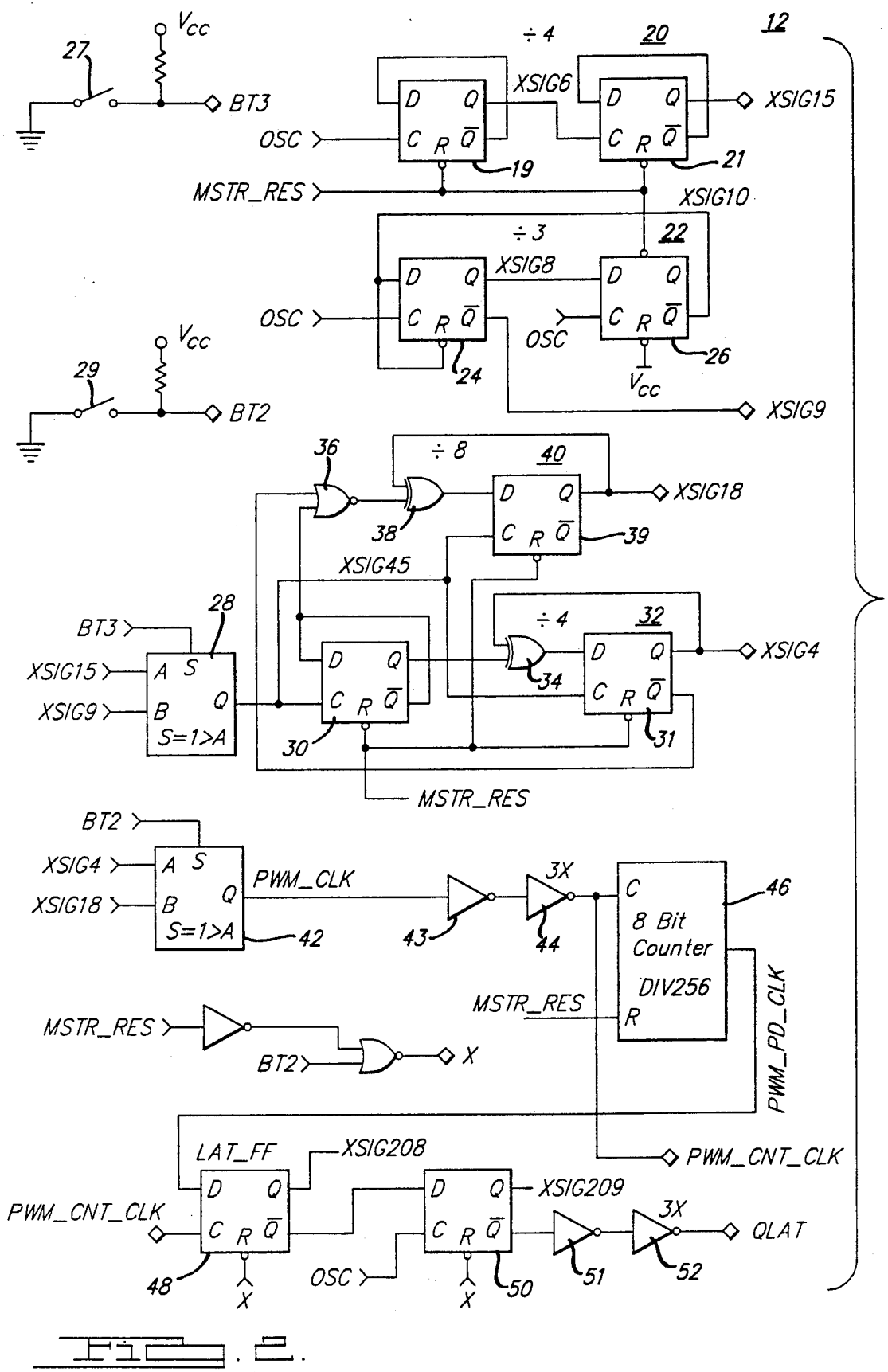
FIG. 2 illustrates as a logic diagram a prescaled-counter circuit used within the PWM circuit of FIG. 1 for providing suitable clocking arrangements for a variety of air-core gauge metering systems.
Figure 7:
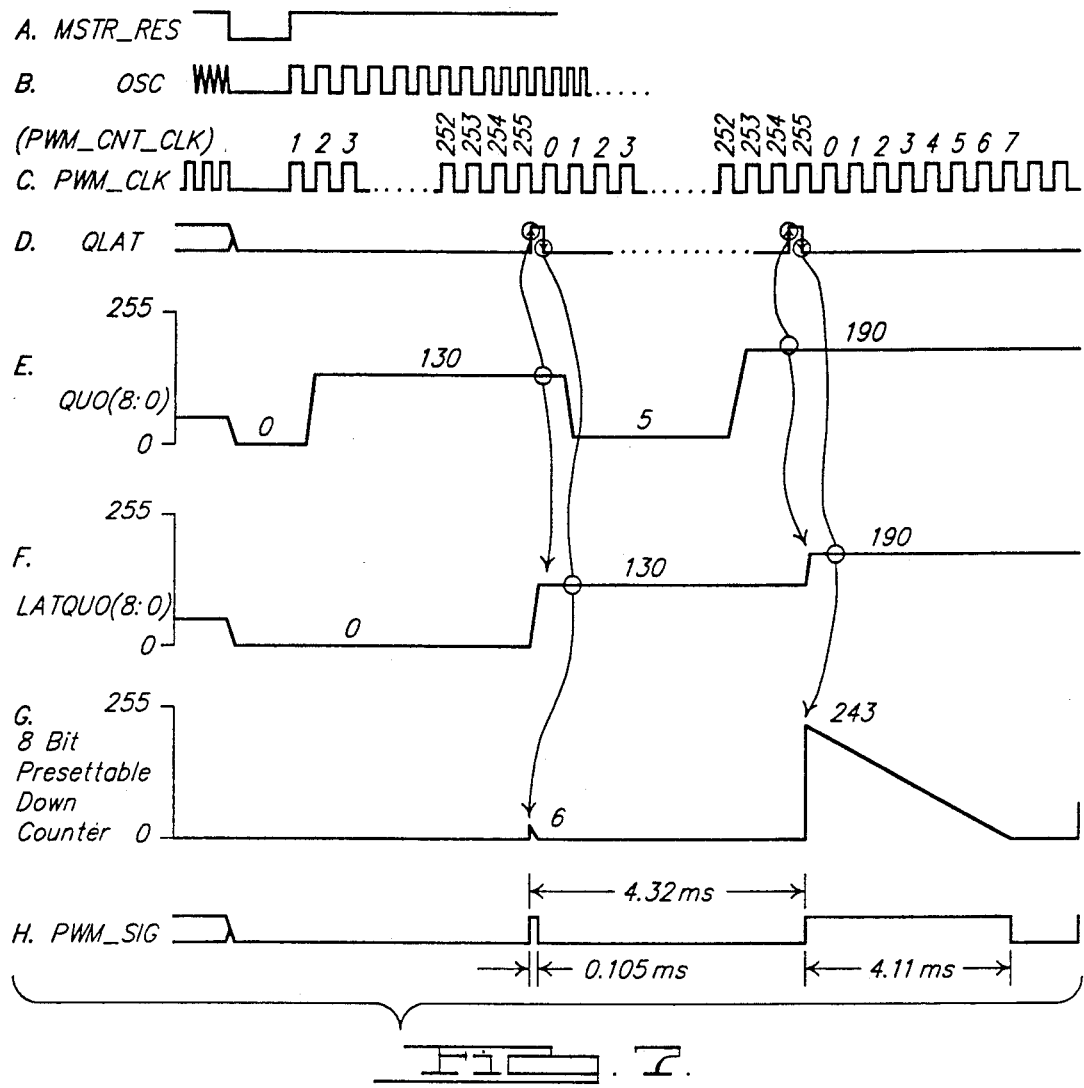
Figure 8:
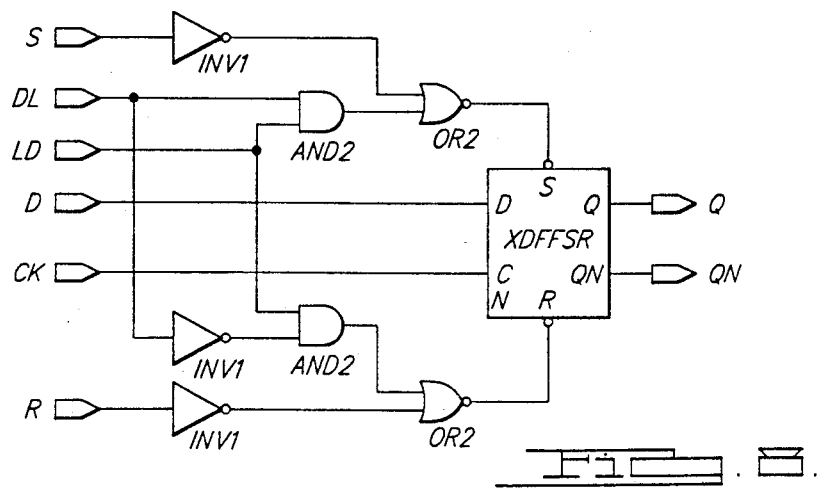

FIGS. 5(A-F) and FIGS. 6(A-C) illustrate output signals from the preloadable-down counter of FIG. 2 at a chosen frequency;

FIG. 7(A-H) provide timing diagrams illustrating the system operations of the present invention for processing measurand data supplied to the meter system at a chosen frequency;

FIG. 8 depicts a standard equivalent of the loadable D-flip flops of FIG. 3;

FIG. 9 provides a compilation of quadrants, octants codes, the polarity and signal level interpretations of the LATQOU(8:6) codes derived from the latched quotient values latched in step latch 53 of FIG. 3; and FIG. 10 provides a guide in graph form used to select and to match the speedometer operating range to the PWM rate needed for that meter.

DETAILED DESCRIPTION OF A PREFERRED EMBODIMENT

Figure 1:
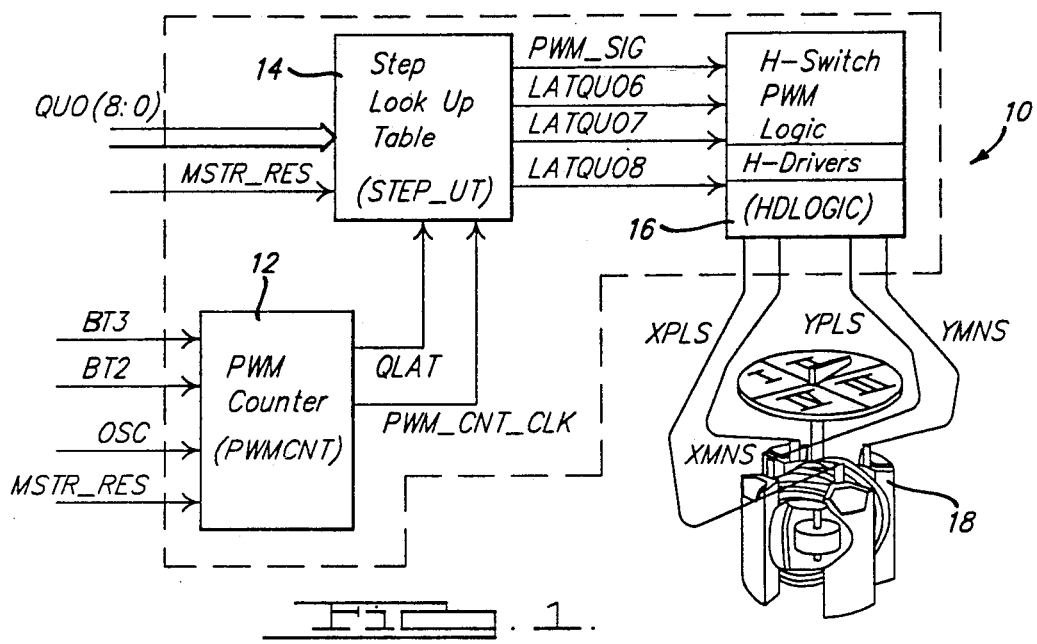
FIG. 1 depicts in a block diagram the improved PWM circuit for receiving measurand data and converting that data into signals for controlling a variety of air-core gauge meter systems of the present invention.

With reference to FIG. 1, a block diagram illustrates circuit 10 capable of converting ROM address data to pulse-width modulated (PWM) signals. Control of the generation of the PWM signals permits operating many different gauges 18 having different dial spans.

Shown in FIG. 1, to determine needle position, the input circuits accept, illustratively, binary coded, nine bit bytes (QUO 8:0) of frequency values, clock oscillator (OSC) signals and a master reset (MSTR-RES) signal from a pulse period-to-frequency-conversion system. The period-to-frequency conversion system converts period measurements of distance pulses from a distance sensor into frequency values. The frequency values equate to deflection steps/degrees of a mph meter scale. U.S. Pat. No. 5,077,519 dated Dec. 31, 1991 of Paul Markow et. al. entitled "Pulse Period to Frequency Conversion System" describes such a period-to-frequency conversion system.

Also, a suitable computer arrangement providing binary coded, nine bit bytes (QUO 8:0) of values ranging from 0–511 would suffice in place of a period-to-frequency converter.

Each nine bit byte (QUO 8:0) or step that enters the Step-Look-Up Table circuit (STEPLUT) 14 contains an address of stored information. The stored information (Stored in a ROM not shown) represents one of the 512 locations that the gauge needle may point over a 0–360 degree scale. Although the stored information relates to only 256 locations, the data is used twice to cover the remaining areas of the scale.

To synchronize the transfer of QUO (8:0) into STEPLUT 14, a PWM Counter circuit (PWMCNT) 12 generates a quotient latched (QLAT) signal after receipt of an oscillator clock signal (OSC). QLAT clocks QUO(8:0) into STEPLUT 14.

PWMCNT 12 also provides inputs for signal (BT2 and BT3() from two manually operated selector switches (not shown) used to divide OSC by four separate divisors. The divisors permit presenting QLAT in four selected frequencies when latching each QUO address into the ROM look-up table in STEPLUT 14. In this embodiment, the PWMCNT 12 allows for divider selections of 12, 16, 24 or 32. This variety of frequencies permit matching this pulse width modulator system to a variety of gauges with different sweep speeds, gauge scales and preferred operating PWM frequencies.

Synchronized output signals (LATQUO6-8) and the pulse width modulated signal (PWM-SIG) from STEPLUT 14 enter H-switch PWM Logic circuit 16. Circuit 16 contains combinatorial logic circuits and half-bridge drivers. The combinatorial logic circuits generate polarity and control signals. These signals direct modulation of PWM-SIG routed to the H-drivers to control current through one of the X or Y coils of the gauge while inhibiting current modulations to the H-driver connected to the other coil. The other coil receives a 100% duty cycle signal.

PWM COUNTER

FIG. 2 depicts in logic and block diagram form PWMCNT 12. PWMCNT 12 permits dividing OSC by four selections of integer dividers; i.e., 12, 16, 24 or 32. Operating binary switches 27 and 29 enable the selection.

The results of the division produce QLAT signals or frequencies of around 617, 462, 309 and 231 Hz. Illustratively, the OSC signal enters PWMCNT 12 and counter 20 divides OSC (1.896 MHz) by 4 using D-FFs 19 and 21 producing XSIG15 (474 kHz). Counter 22 also divides OSC by 3 using D-FFs 24 and 26 producing XSIG9 (632 kHz).

FIG. 5 depicts the waveform development of XSIG15 and XSIG9. XSIG15 (OSC/4) of FIG. 5C results from the generation of XSIG6 (OSC/2) of FIG. 5B. FIG. 5A depicts OSC. XSIG9(OSC/3) results from the generation of XSIG8 (XSIG6/2) and the generation of XSIG10 (XSIG8/2).

Thereafter, multiplexers (MUX) 28 and 42 of FIG. 2 are programmed in binary form using BT3 and BT2 selector switches 27 and 29, respectively, to further divide OSC by 12, 16, 24 and 32. A special divide by 8 counter, comprising NOR gate 36, XOR gate 38 and D-FF 39, uses signals from MUX 28 to generate XSIG18. Another special divide by 4 counter, using D-FFs 30 and 31 and XOR gate 34, generates XSIG4. These special counters are look-ahead type counters whose input signals are known before the clock signal gets to the D-FF. The combinatorial logic of these counters puts the next state of the output signal at the D-input of the D-FF prior to the clock signal reaching the D-FF. The combinatorial logic permits simultaneous changes in all of the D-FFs. These look-ahead type counters provide signals that reduce propagation delays in PWMCNT 12 associated with generating QLAT. The XSIG45, XSIG4 and XSIG18 signals depicted in FIGS. 6(A-C) show the further divisions of the OSC signal.

Table 1 summarizes the generation of the further division of the OSC signal. Table 1 shows the binary programming of switches 27 and 29 of FIG. 2 needed to cause CTR's 20, 22, 40 and 32 to accomplish the various division operations of the OSC signal. Note in FIG. 2 that MUX 28 deals with XSIG15 and XSIG9 while MUX 42 deals with XSIG 18 and XSIG4.

TABLE 1

| PWM_CLK | BT2 | BT3 | ÷4 CTR 20 XSIG15 | ÷3 CTR 22 XSIG9 | ÷8 CTR 40 XSIG18 | ÷4 CTR 32 XSIG4 |
|---|---|---|---|---|---|---|
| OSC/24:79 kHz | 0 | 0 | 474 kHz | 632 kHz | 79 kHz | 158 kHz |
| OSC/32:59.25 | 0 | 1 | 474 kHz | 632 kHz | 59.25 kHz | 118.5 kHz |
| OSC/12:158 | 1 | 0 | 474 kHz | 632 kHz | 79 kHz | 158 kHz |

TABLE 1-continued

| PWM_CLK | BT2 | BT3 | ÷4<br>CTR 20<br>XSIG15 | ÷3<br>CTR 22<br>XSIG9 | ÷8<br>CTR 40<br>XSIG18 | ÷4<br>CTR 32<br>XSIG4 |
|---|---|---|---|---|---|---|
| OSC/16:118.5 | 1 | 1 | 474 kHz | 632 kHz | 59.25 kHz | 118.5 kHz |

The output signal from MUX 42 represents the PWM clock (PWM-CLK) signal. This signal routes through inverter 43 and another inverter 44 having three times the drive as does inverter 43 and emerges as the PWM COUNTER CLOCK (PWM-CNT-CLK) signal.

The PWM-CNT-CLK signal routes to an 8-Bit Counter 46 for dividing this input signal by 256 and providing the PWM Period Clock (PWM-PD-CLK) signal. This signal permits starting each new cycle of the PWM-CNT-CLK signal used to generate QLAT.

The PWM-PD-CLK routes to the data input terminal of D-FF48 where PWM-CNT-CLK signal provides the clocking for generating XSIG208 (PWM-PD-CLK/2) at a Q-output of D-FF48. The inverted output of D-FF48 routes to D-FF50 where the OSC signal provides the clocking for generating XSIG209. Both XSIG208 and XSIG209 are generated for synchronization purposes. Synchronizing PWM-PD-CL with PWM-CNT-CLK and with OSC avoids race conditions in the counter.

The inverted output of D-FF 50 (/XSIG209) routes through another pair of inverters 51 and 52 to generate QLAT. As mentioned supra, QLAT clock latches each 9 bit deflection step value (QUO(8:0)) into a 9 bit step latch D-FF (STEPLAT) 53 in STEPLUT 14 of FIG. 1. The synchronizing of PWM-PD-CLK to PWM-CNT-CLK and OSC makes sure that QUO byte settles down before being latched into STEPLAT 53.

STEP LOOK UP TABLE CIRCUIT

Referring now to FIG. 3, this figure depicts STEP-LOOK-UP table circuit (STEPLUT) 14. STEPLUT 14 includes the STEPLAT 53, a 256 × 8 read-only-memory (ROM) 54 and an 8-bit loadable counter (LDCTR) 55.

One QLAT signal routes from PWMCNT 12 of FIG. every 256 PWM-CNT-CLK pulses. A rising edge of each QLAT pulse latches into step latch 53 a QUO(8:0) value. This forms a latched quotient byte (LATQUO 8:0) at the Q output to bus 57. By omitting the upper bit of each LATQUO byte, bits 7-0 form the ROM address for addressing one of the 256 addressable locations of ROM 54. When addressed, ROM 54 produces at the data output terminal (DAT) the quotient look-up-table (QLUT(7:0)) value.

Figure 4:
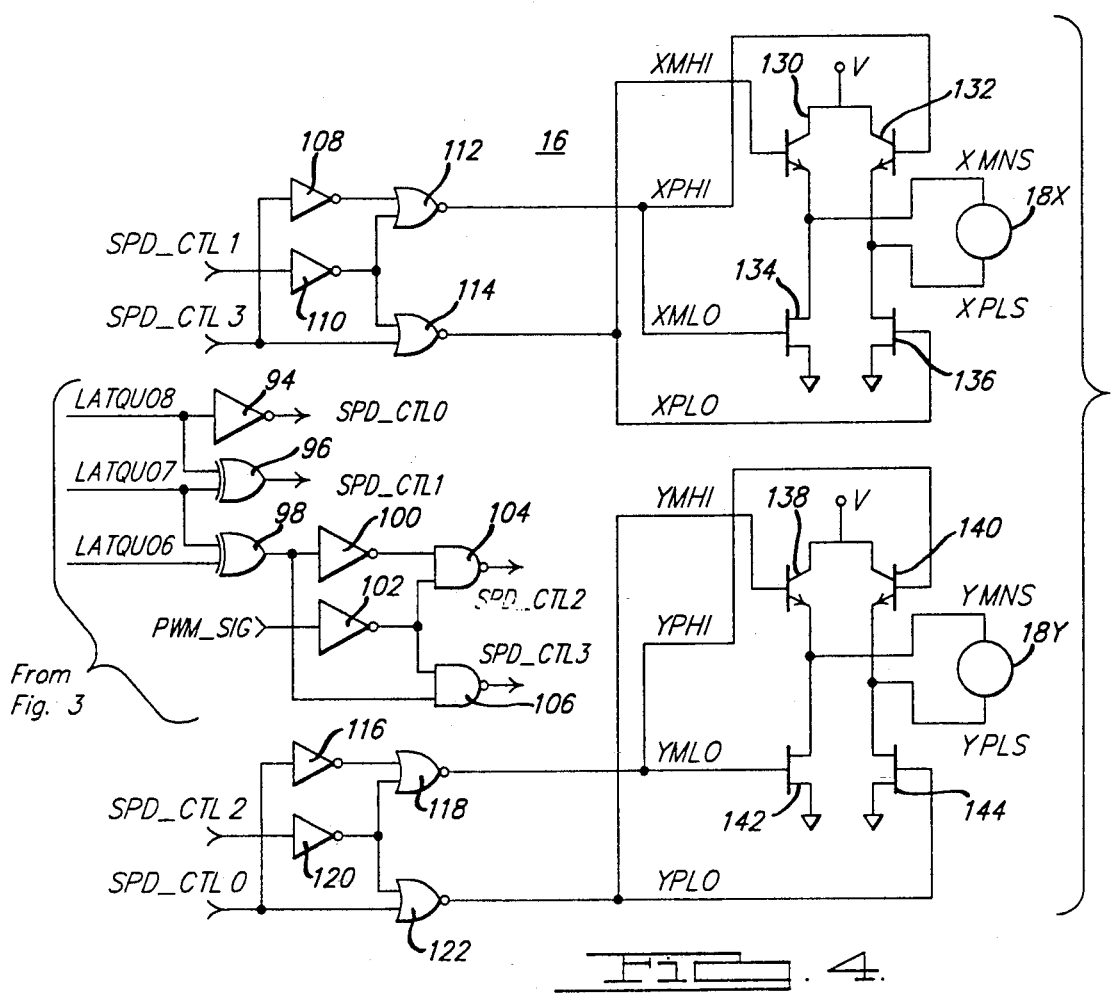
FIG. 4 illustrates the combinatorial logic circuit that receives the PWM and control signals from the circuit of FIG. 3 and provides control signals to driver circuits for controlling the current in the X and Y coils of the air-core gauges.

The upper three bits (LATQUO(8-6)) of each byte provide the codes used by the logic in HDLOGIC 16 of FIG. 4 for determining the polarity of the current flowing in the air-core gauge coils and which coil to hold HIGH while modulating the other.

THE EIGHT-BIT LOADABLE COUNTER

The 8-bit loadable counter (LDCTR) 55 of FIG. 3 comprises a group of eight presetable D-FFs (PD-FF) configured as a down counter. FIG. 8 depicts an equivalent circuit of the PD-FFs in LDCTR 55 of FIG. 3. Upon POWER UP, a LOW on the MSTR-RES line "d" initializes the Q output terminals of LDCTR 55 to zero. The MSTR-RES signal and a HIGH not (/) Q output signal of D-FF 86 combine in NAND gate 88 and inverter 90 to generate a RESET pulse to D-FF 92 to generate a LOW PWM-SIG. LDCTR 55 counts down to zero from any of the 255 selectable quotient look-up-table values selected from ROM 53 and routed over bus "a" to the DL terminals of LDCTR 55 as an 8-bit parallel word. During the occurrence of a falling edge of the QLAT pulse signal, which routed over line "b" to the LD terminal of each PD-FF, the binary value of the bits appearing at the DL terminal of each PR-FF move to the respective Q output terminal. Also, each falling edge of the QLAT pulse which routes to inverter 82 (also called HUEY) initializes LDCTR 55 by setting the PWM-SIG HIGH at the Q output terminal of D-FF 92. With the PWMO-SIG HIGH, the PWM-CNT-CLK decrements LDCTR 55 via NAND gate 64 until the count in PD-FF 55 reaches zero. The clock signal from gate 64 is called DEWEY. When a rising edge of the clock signal, DEWEY, occurs, the bit value at the D terminal moves to the Q output terminal forcing the bit value previously stored to move out of the Q output terminal and on to the next circuit. The signal DEWEY occurs in response to the pulses of the PWM-CNT-CLK signal at the output of NAND gate 64 when enabled by a HIGH PWM-SIG.

If just a loadable counter was used, ripple or propagation times of the bit values through LDCTR 55 would occur slower than the time between successive PWM_CNT_CLK signals. Hence, to deduce the ripple delay of the rippling bits, LDCTR 55 used "LOOK AHEAD BORROW" circuits. To explain the operation of the LOOK AHEAD BORROW circuits, consider arranging the eight PD-FFs into three groups. A LOW signal on the Q output terminals of the first group consisting of PD-FFs 56, 58, and 59, route to the inputs of NOR gate 62 for the purpose of generating a HIGH output signal or a BORROWED signal on line "c∞ when the bit value at the D terminal transfers to the Q output terminals. This output signal from NOR gate 62 represents a signal borrowed from the first group of PD-FFs given an indication that the bits in this first group of PD-FFs will count down to zero prior to the actual completion of the count down to zero.

The second group of PD-FFs consisting of PD-FFs 68 and 70 do not start to ripple down to zero until the BORROWED signal on line "c" goes HIGH. But instead of waiting until the first group of PD-FFs counts down to zero, the second group gets a head start as a result of the BORROWED signal and starts its counting down prior to the completion of the counting down to zero of the first group of PD-FFs. Hence, some ripple delay removal occurs between the first two groups of PD-FFs. This borrowed signal routes to XOR gate 66 which places a HIGH at the D terminal of PD-FF 68 initiating the count down of the second group of PD-FFs when the next DEWEY clock pulse occurs.

The count down of the third group of PD-FFs consisting of PD-FFs 76, 78 and 80 starts when a HIGH BORROWED signal appears at the output of NOR 62. The borrowed signal causes the count down to zero to start in the third group of PD-FFs at the same time the rippling down of bits occur in the second group of PD-FFs. The output of NAND gate 72 remains HIGH while the signal DEWEY remains LOW holding the output of XNOR 74 and the D terminal of PD-FF 76 LOW. Hence, the third group of PD-FFs remain disabled until the occurrence of the HIGH BORROWED signal from NOR gate 62. The output of NOR gate 84 called LOUIE remains LOW inhibited by the HIGH signal from NAND gate 72. When the output of NAND gate 72 goes LOW and the third group of PD-FFs counts down to zero, the output of NOR gate 84 goes HIGH causing D-FF 86 to latch and the /Q output to go LOW. A LOW at the /Q output terminal of D-FF 86 and a HIGH MSTR-RES signal cause the output of NAND 88 and inverter 90 to place a LOW signal at the reset terminal of D-FF 92 changing the PWM-SIG to a LOW signal inhibiting counter LDCTR 55. The PWM-SIG remains LOW until receipt and loading of the next byte address. This PWM-SIG along with speed control signals generate the current modulations in the stator coils when moving the gauge needle through all octants of the gauge dial.

H-DRIVER PWM LOGIC CIRCUIT

The H-driver PWM logic circuit 16 of FIG. 4 receives the LATQUO(8L6) codes from the step latch 53 of FIG. 3 and provides the control signal derived from combinatorial logic for actuating the X and Y coils of gauge 18.

Controlling Current in the X and Y coils using SPD—CTLO—3 Signals

With reference to FIG. 4, current through coil 18X flows from the positive terminal (X PLS) to the minus terminal (X MNS) when transistors 132 and 134 are turned ON. Current flows through coil 18X in the opposite direction when transistors 130 and 136 are turned ON.

Controlling Current in Coil 18X

To cause current to flow in the positive direction through coil 18X, both signals XPHI and LMLO must go HIGH. XPHI goes HIGH when the output of NOR gate 112 goes HIGH. NOR gate 112 goes HIGH if HIGH SPD-CTL 1 and 3 signals route to the input of inverters 108 and 110, respectively. A HIGH SPD-CTL 1 occurs if a HIGH LATQU07 or LATQU08 applies to XOR gate 96. A HIGH SPD-CTL 3 occurs if a HIGH PWM-SIG applies to the input of inverter 102 or a HIGH LATQU07 or LATQU06 signal routes to XOR gate 98.

To cause current to flow in the negative direction through coil 18X, both signals XMHI and XPLO must go HIGH. XMHI and XPLO go HIGH when the output of NOR gate 114 goes HIGH. NOR gate 114 goes HIGH if a LOW SPD-CTL 1 signal routes to one of the inputs of NOR gate 114 while a HIGH SPD-CTL3 signal applies to the input of inverters 110 and a HIGH signal from the output of inverter 110 applies to the other input of NOR gate 114.

Controlling Current in Coil 18Y.

To cause current to flow in the positive direction through coil 18Y, both signals YPHI and YMLO must go HIGH. YPHI and YMLO go HIGH when the output of NOR gate 118 is HIGH. NOR gate 118 goes HIGH if HIGH SPD-CTL 0 and 2 signals apply to the input of inverters 116 and 120 respectively. A HIGH SPD-CTL 0 occurs if a HIGH LATQU08 applies to inverter 94. A HIGH SPD-CTL 2 occurs if a HIGH PWM-SIG applies to the input of inverter 102 over a HIGH LATQU07 or LATQU06 signal routes to XOR gate 98.

To cause current to flow in the negative direction through coil 18Y, both signals YMHI and YPLO must go HIGH. Both YMHI and YPLO go HIGH when the output of NOR gate 122 goes HIGH. NOR gate 122 goes HIGH if a LOW SPD-CTL 0 signal applied to one of the inputs of NOR gate 122 while a HIGH SPD-CTL2 signal applies to the input of inverters 120 and HIGH signal from the output of inverter 120 applies to another input of NOR gate 122.

The data in the X-COIL and Y-COIL columns of FIG. 9 summarizes the polarity and magnitudes of the PWM signals to the X and Y coil H-drivers in response to the LATQUO (8:6) codes used in deflecting the dial needle over the 8 octants.

Operation of the system

To use this system, the sweep span of the meter must be matched to the PWM rate required for operation. A graph FIG. 10, has been provided which helps in making the match. This graph was formed by use of the following two equations for determining PWM and OSC frequencies:

(1) PWM freq. = OSC freq./(prescaler(12–32)×256) and (2) OSC freq. = (max MPH/max deflection angle)×2,048,000.

The first step in using this graph is to select the meter to be operated. The graph shows curve graduations of speedometer speeds ranging from 85 MPH to 150 MPH. Assume a 125 MPH speedometer is to be used.

The second step is to select the degrees of the deflection of the needle of the meter. The vertical axis of the graph provides degrees of deflection. Assume 135 degrees of deflection.

The third step is to relate the selected degrees of deflection and the range of speedometer to the OSC frequency presented along the horizontal axis of the graph. Hence, an abscissa from 135 degrees of deflection along the vertical axis intersects the 125 MPH curve at a point where an ordinate from that point extends to an OSC frequency value of 1.892 MHz along the horizontal axis.

The fourth step is to determine PWM by finding which divisor line or prescaler (12, 16, 24 and 32) intersects an ordinate extending from the determined OSC frequency (1.892 MHz) and then from that point extend an abscissa to the vertical axis to determine the PWM value along the vertical axis of the graph. (Namely, 231 Hz).

Using the above values, referring now to FIG. 7 (A–H), these waveforms depict the system operations when the system receives QUO(8:0)'s of 130 and 190. These QUO's represent the number of steps to deflect the gauge needle.

FIG. 7A depicts the receipt of a master-reset pulse which resets the system and initializes the storing devices.

FIG. 7B illustrates the oscillator clock (OSC) waveform of a frequency of 1.896 MHz and a period of 0.527 µs. At this frequency, the PWM frequency should be 231 Hz.

FIG. 7C depicts PWM-CNT-CLK, the OSC signal divided by 32 after the manual generation of a PWM-SEL signal (BT3) by an operator in accordance with Table 1. The BT3 signal selects the correct port of MUX 42 of FIG. 2 for generating a PWM-CNT-CLK signal of a frequency of about 59.26 kHz with a period of 16.875 μs.

PWMCNT 12, at this frequency, increments 255 steps and then generates a QLAT signal for latching the QUO value in the step latch 53 of FIG. 3 (See FIGS. 7C, 7D and 7E).

As the period-to-frequency conversion system supplies the QUO values to the step latch 53 and QLAT latch only the QUO values that are not changing when QLAT occurs are latched in step latch 53. (See FIG.'S 7E and 7F). Note that QUO changes to a value of 5, but the system ignores the change since the value wasn't prevalent during a QLAT. Only the 190 and 130 values bear any significance.

For a LATQUO of 190, the 8-bit presetable down counter (LDCTR) 55 decrements 243 times before reaching zero. (See FIG. 7G). This count results from the following calculations: $190/512$ steps$\times 360°=133.6°$. Since this value exceeds 90° the needle should move out of the first quadrant into the second quadrant or third octant. Tan $(43.6°)\times 256$ steps equals $0.952\times 256$ or a PWM-SIG count of 243.

Shown in FIG. 7H, the period of the PWM-SIG equals 4.32 ms.; hence, $4.32\times 0.952$ yields an ON time of 4.11 ms. and an OFF time of 0.21 ms.

Using the same procedure for a LATQUO of 130, the calculations go as follows: $130/512$ steps$\times 360°=91.4°$. Since this value also exceeds 90°, the needle should move to a position in the third octant. Tan $(1.4°)\times 256$ steps equal a PWM-SIG count of 6. Hence, (LDCTR) 12 decrementing from 6 down to zero yields a PWM-SIG ON time of 0.105 ms. and an OFF time of 4.20 ms.

While this invention has been described in reference to the illustrated embodiment, it will be understood that various modifications may be made thereto, and that systems incorporating such modifications may fall within the scope of this invention, which is defined by the appended claims.

The embodiments of this invention in which an exclusive property or privilege is claimed are defined as follows.

What is claimed is:

1. A variable drive apparatus for an air core gauge, comprising:
   (a) variable PWM counter with an input terminal for receiving a chosen fixed clock oscillator signal and having at least a pair of multiplexer circuits for digitally selecting a plurality of PWM clock signals scaled down from the clock oscillator signal and after the selection of one of the plurality of scaled down PWM clock signals which matches the frequency required for operating a chosen air core gauge, producing at one output terminal pulse signals at a selected PWM clock signal, and producing at another output terminal a quotient latch signal each time after counting a chosen number of pulses of the selected PWM clock signal,
   (b) a ROM-BASE current controller having one input terminal for receiving input data related to a measurand to be displayed, a second input terminal for receiving the quotient latch signal for initiating converting the input data into current direction control signals and into address bytes for addressing a ROM having selected time period data stored therein used by a down counter that decrements at the rate of the selected PWM clock signal from a selected time period provided from the addressed time period data down to a zero count and while the down counter is decrementing toward the zero count, producing at a set of output terminals, the current direction control signals and at an independent output terminal an enabling PWM signal which changes to a disabling PWM signal when the down counter decrementations reach zero;
   (c) a half-bridge driver current control circuit having logic circuits for receiving the PWM signal and the control signals, and producing at a first output port modulated current for exciting an X-axis oriented gauge coil and at a second output port modulated current for exciting a Y-axis oriented gauge coil, the modulation current for exciting one of the gauge coils being held at 100% modulation while the other gauge coil receives current modulated at the selected PWM clock signal and flowing in the direction dictated by the current direction control signals, the modulation currents developing current signals in the X- and Y- axes oriented gauge coils, having a vectorial relationship which causes a rotor with a dial needle connected thereto to rotate to dial positions indicative of the magnitude and direction of the measurand.

2. Apparatus of claim 1 wherein the chosen fixed clock oscillator signal is selected to permit generating a plurality of PWM clock signals in order to have a selection of PWM clock signals for operating many different gauges having different dial spans.

3. Apparatus of claim 1 wherein the ROM-BASE current controller contains a nine bit step latch that receives the input data as a nine bit data byte and outputs the three most significant bits of each nine-bit data byte as current direction control signal over a first bus and outputs all nine bits of each byte as the address byte which routes over a second bus to the ROM in response to the receipt of the quotient latch signal, the ROM containing a sufficient number of byte locations to provide storage for data that can identify the total number of steps needed to cover the sweep span of the dial needle.

4. Apparatus of claim 3 wherein the down-counter of the ROM-BASE current controller contains look ahead borrow circuitry for reducing the ripple delay when decrementing toward a zero count.

5. Apparatus of claim 4 wherein the variable PWM counter having at least the pair of multiplexer circuits permits dividing the clock oscillator signal by 12, 16, 24 or 32 and providing corresponding quotient latch signals that having a period of 1/256 of the divided clock oscillator signal.

6. Apparatus of claim 5 wherein the variable PWM counter is formed from: (1) a divide by 4 and a divide by 3 counter, both of which are used to independently divide the clock oscillator(OSC) signal, (2) a first multiplexer circuit of the pair of multiplexer circuits having a divide by 8 counter and a divide by 4 counter for dividing the OSC/4 signal or the OSC/3 signal by 8 or 4 to provide at a first output terminal an OSC/24 or an OSC/32 signal and at a second output terminal an OSC/16 or an OSC/12 signal and (3) a second multiplexer circuit used in conjunction with the first multiplexer circuit to provide for selecting one of the four divided oscillator clock signals as the PWM CLK signal used by the ROM-BASE current controller to decrement the down counter.

7. Apparatus of claim 6 wherein the variable PWM counter also includes an eight bit divide by 256 counter for dividing the PWM CLK signal by 256 which computes the period of PWM CLK signal and a synchronizing circuit used to synchronize the PWM CLK signal with the period of the PWM CLK signal and with the OSC signal to avoid race conditions in the variable PWM counter, the output of the synchronizing circuit being the quotient latch signal; wherein flip-flops used to form the various dividing counters are D-type flip-flops and wherein the counters in the first multiplexer circuit are look ahead type counters for reducing the propagation delays during the dividing operations.

8. Apparatus of claim 7 wherein the down counter in the ROM-BASE current controller includes an arrangement of eight programmable D-flip flops (PD-FFs) into three groups, wherein a first group of three PD-FFs contains a look ahead borrow circuit for generating a borrowed signal that gives an indication that the bits in this first group of PD-FFs will count down to zero prior to the actual completion of the count down to a zero value, wherein instead of waiting until the first group of PD-FFs counts down to zero, a second group consisting of two PD-FFs receives a head start as a result of receipt of the borrowed signal from the first group of PD-FFs and starts counting down toward a zero prior to the completion of the counting down of the first group of PD-FFs removing some of the ripple delay between the first two groups of PD-FFs, and wherein the count down of a third group of PD-FFs starts in response to the borrowed signal at the same time the rippling down of bits occurs in the second group of PD-FFs.

9. Apparatus of claim 8 wherein the down counter in the ROM-BASE current controller also includes a circuit for detacting that all three groups of counters have counted down to zero and thereafter for inhibiting the down counter until receipt and loading of the next byte address.

10. Apparatus of claim 9 wherein the half-bridge driver current control circuit includes logic circuits that utilize the binary count of the three most significant bits of each quotient latch byte namely LATQUO8:LATQUO6 to select 8 different combinations of speed control signal for controlling the direction and type of modulation of current applied to the gauge coils and where each binary count is used to select one of the eight octants of the gauge and to effect needle movement in the selected octant.

11. Apparatus of claim 10 wherein the logic circuits of the half-bridge driver current control circuit use the three most significant bits of each quotient latch byte to derive four speed control signals namely SPD-CTL0 to SPD-CTL3, wherein SPD-CTL O and SPD-CTL 2 are used to control the direction and magnitude of the current in the X-oriented gauge coil while SPD-CTL 1 and SPD-CTL 3 are used to control the direction and magnitude of the current in the Y-oriented gauge coil.

12. A gauge driver system for driving a variety of air core gauges in response to digitally coded data representing magnitudes and polarities of varying measurands from a measurand sensing device, the driver system comprising:

(a) clock means arranged to receive a fixed clock oscillator signal and for dividing the oscillator signal into a selected number of different PWM clock signals of selected frequencies relative to the oscillator signal, each of the different PWM clock signals having an accompanying quotient latch signal that develops after the occurrence of a chosen multiple of the number of pulses in the selected PWM clock signal;

(b) PWM current controller means connected to the clock means and to the measurand sensing device for receiving the varying measurands as bytes of coded data and then using one of the different PWM clock signals and the coded data to form PWM and polarity signals of durations and polarity proportional to the varying magnitudes and polarities of the varying measurand sensed by the measurand sensing device, the quotient latch signal being used to control receipt of each byte of coded data into the PWM current controller means; and (c) driver means for driving one stator coil of the gauge with PWM and polarity signals for durations and polarities in proportion to the magnitudes and polarities of the measurand while driving another stator coil with a fixed voltage of a chosen polarity to position a needle connected to a rotor to a dial position proportional to the magnitude of the measurand.

13. Apparatus of claim 12 wherein the PWM current controller means includes a ROM having a corresponding number of memory locations as the total number of PWM pulses occurring between the pulse periods signals.

14. Apparatus of claim 13 wherein the PWM current controller means receives the coded data related to the measurand to be displayed, the coded data being in a form which can be used to address ROM locations containing digital words, the digital words containing a number of which a portion of the number represents the magnitude of the measurand and another portion of the number represents polarity of the measurand.

15. Apparatus of claim 14 wherein the digital words from the ROM data locations are eight-bit words wherein the bit word represents the number that is proportional to the magnitudes of the measurands and the controller means uses the eight bits to generate the PWM signal, and wherein the upper three bits of each ROM address word provides coded information for generating polarity signals of the measurand.

16. Apparatus of claim 15 wherein the driver means includes combinatorial logic which uses the PWM signal in combination with the upper three bits of the digital word to develop control signals that control the magnitude and direction of current that flows through the stator coils of the air core gauge and to determine which of the stator coils receive the PWM signal while the other receives the fixed voltage signal, the fixed voltage signal representing a 100% duty cycle signal, the PWM signal having a duty cycle proportional to the magnitude of the measurand.

17. Apparatus of claim 16 wherein the PWM signal and the fixed voltage signal are alternated between the first and the other stator coil s the driver system causes the needle to move from one octant of the gauge to the next octant when the responses to varying measurands dictate movement of the needle beyond an octant, wherein the alternations between stator coils is govern by the reactions of the combinatorial logic in the driver means.

* * * * *